(12) United States Patent  (10) Patent No.: US 7,304,521 B2
Carley et al.  (45) Date of Patent: Dec. 4, 2007

(54) DELAY CIRCUIT FOR SYNCHRONIZING ARRIVAL OF A CLOCK SIGNAL AT DIFFERENT CIRCUIT BOARD POINTS

(75) Inventors: Adam L. Carley, Windham, NH (US); Daniel J. Allen, Derry, NH (US); James E. Mandry, N. Andover, MA (US)

(73) Assignee: Altera Corporation, San Jose, CA (US)

( * ) Notice: Subject to any disclaimer, the term of this patent is extended or adjusted under 35 U.S.C. 154(b) by 32 days.

(21) Appl. No.: 11/044,336

(22) Filed: Jan. 28, 2005

(65) Prior Publication Data

US 2006/0170476 A1  Aug. 3, 2006

(51) Int. Cl.
H03H 11/26 (2006.01)
(52) U.S. Cl. ............... 327/278; 327/276; 327/264
(58) Field of Classification Search ........... 327/158, 327/161, 149, 276, 281, 153, 261, 264, 272, 327/278, 285
See application file for complete search history.

(56) References Cited

U.S. PATENT DOCUMENTS

| | | | |
|---|---|---|---|
| 5,039,893 A | 8/1991 | Tomisawa | |
| 5,111,085 A | 5/1992 | Stewart | |
| 5,359,301 A | 10/1994 | Candage | |
| 5,459,422 A * | 10/1995 | Behrin | 327/276 |
| 5,949,268 A | 9/1999 | Miura et al. | |
| 6,150,862 A | 11/2000 | Vikinski | |
| 6,205,086 B1 | 3/2001 | Hanzawa et al. | |
| 6,272,439 B1 * | 8/2001 | Buer et al. | 702/75 |
| 6,373,312 B1 | 4/2002 | Barnes et al. | |
| 6,377,094 B1 | 4/2002 | Carley | |
| 6,404,258 B2 | 6/2002 | Ooishi | |
| 6,489,823 B2 | 12/2002 | Iwamoto | |

(Continued)

FOREIGN PATENT DOCUMENTS

EP 0639003 A 2/1995

(Continued)

OTHER PUBLICATIONS

International Search Report dated Sep. 25, 2006 in connection with PCT Application No. PCT/US06/01728.

*Primary Examiner*—Dinh T. Le
(74) *Attorney, Agent, or Firm*—Edell, Shapiro & Finnan, LLC

(57) ABSTRACT

A clock signal generation system and method to distribute at least one clock signal to a plurality of points on a circuit board using a plurality of digitally programmable delay circuits each of which delays the clock signal by a desired amount so as to synchronize arrival of the clock signal when distributed to each of the plurality of points on the circuit. Each digitally programmable delay circuit comprises a plurality of circuit stages connected in series with each other. Each circuit stage comprises a plurality of transistors of a first type (e.g., P-type) connected in parallel with each other, and a plurality of transistors of a second type (e.g., N-type) connected in parallel with each other. In each circuit stage, one or more of the plurality of transistors of the first type are selected to delay a rising edge, and one or more of the plurality of transistors of a second type are selected to delay a falling edge.

28 Claims, 7 Drawing Sheets

U.S. PATENT DOCUMENTS

| | | |
|---|---|---|
| 6,518,811 B1 | 2/2003 | Klecka, III |
| 6,573,777 B2 | 6/2003 | Saint-Laurent et al. |
| 6,664,832 B2 | 12/2003 | Carley |
| 6,664,837 B1 * | 12/2003 | Oh et al. .................... 327/270 |
| 6,771,105 B2 | 8/2004 | Andrasic et al. |
| 6,836,166 B2 | 12/2004 | Lin et al. |
| 6,859,082 B2 | 2/2005 | Tang |
| 2006/0170482 A1 | 8/2006 | Carley et al. |

FOREIGN PATENT DOCUMENTS

JP  0639003 A  *  7/1994

* cited by examiner

DELAY CIRCUIT FOR SYNCHRONIZING ARRIVAL OF A CLOCK SIGNAL AT DIFFERENT CIRCUIT BOARD POINTS

This application is related to commonly assigned co-pending U.S. application No. 11/044,315, filed on even date, and entitled "Digitally Programmable Delay Circuit with Process Point Tracking," U.S. Published Patent Application No. US 2006-0170482 A1, the entirety of which is incorporated herein by reference.

BACKGROUND OF THE INVENTION

The present invention relates to a phase adjustable delay circuit and to a technique for phase adjusting a clock signal that is connected to different components on circuit board to synchronize the arrival of the clock signal at various points on the circuit board.

Clock chips typically generate a particular clock signal (or several synchronized clock signals at frequency multiples) for distribution to multiple points on a circuit board. At the clock rates of current clock chips, synchronizing the arrival time along the various paths to the different points on the circuit board is a difficult task. The current solution is to use "serpentine traces" in which otherwise-too-short paths are lengthened by having the traces zigzag across the circuit board while traces to distant points on the circuit board are more direct. This inefficiently uses circuit board area, radiates additional electromagnetic interference (EMI) for the lengthened paths, and cannot be easily altered during circuit board debugging after circuit board assembly.

Consequently, a delay circuit and method is needed to simplify the synchronization of a clock signal distributed to different points on a circuit board.

SUMMARY OF THE INVENTION

Briefly, a clock signal generation system and method are provided to distribute at least one clock signal to a plurality of points on a circuit board using a plurality of digitally programmable delay circuits each of which delays the clock signal by a desired amount so as to synchronize arrival of the clock signal when distributed to each of the plurality of points on the circuit.

Each digitally programmable delay circuit comprises a plurality of circuit stages connected in series with each other and a first circuit stage being coupled to a line carrying a signal having edges to be delayed. Each circuit stage comprises a plurality of transistors of a first type (e.g., P-type) connected in parallel with each other, and a plurality of transistors of a second type (e.g., N-type) connected in parallel with each other. In response to a delay control signal, in each circuit stage, one or more of the plurality of transistors of the first type are selected to delay an edge of a first type (e.g., rising edge) and one or more of the plurality of transistors of a second type are selected in each circuit stage in response to a delay control signal to delay an edge of a second type (e.g., falling edge).

A selector logic circuit is provided that generates transistor select signals for the circuit stages. The selector logic circuit may generate transistor select signals at each level (step or count) of the delay control signal (e.g., a delay select code) such that there is a one-to-one association between a particular transistor pair (comprising a P-type transistor and an N-type transistor) and each level of the delay select code. The circuit topologies described herein have extremely good delay linearity but are also tunable to achieve the same degree of linearity in nearly any CMOS technology.

The delay control signal may be based on a desired delay amount and a measure of instantaneous process, voltage and temperature conditions of an integrated circuit in which the plurality of transistors are implemented. One of the problems as semiconductor fabrication technologies advance (become more miniaturized) is a long term drift of P-type and N-type device thresholds. The techniques described herein of passing a specific rising/falling edge through banks of sized P-type and N-type devices to track process, temperature, and voltage variations will also serve to track long term P-type and N-type threshold drifts.

These techniques of using a single transistor in a bank of many transistors with individual selects can deliver an unprecedented level (picoseconds) of granularity on a waveform edge, a level of performance heretofore extremely difficult to achieve, yet virtually required as fabrication technologies advance.

Other objects and advantages will become more apparent when reference is made to the following description taken in conjunction with the accompanying drawings.

DETAILED DESCRIPTION

Figure 1:
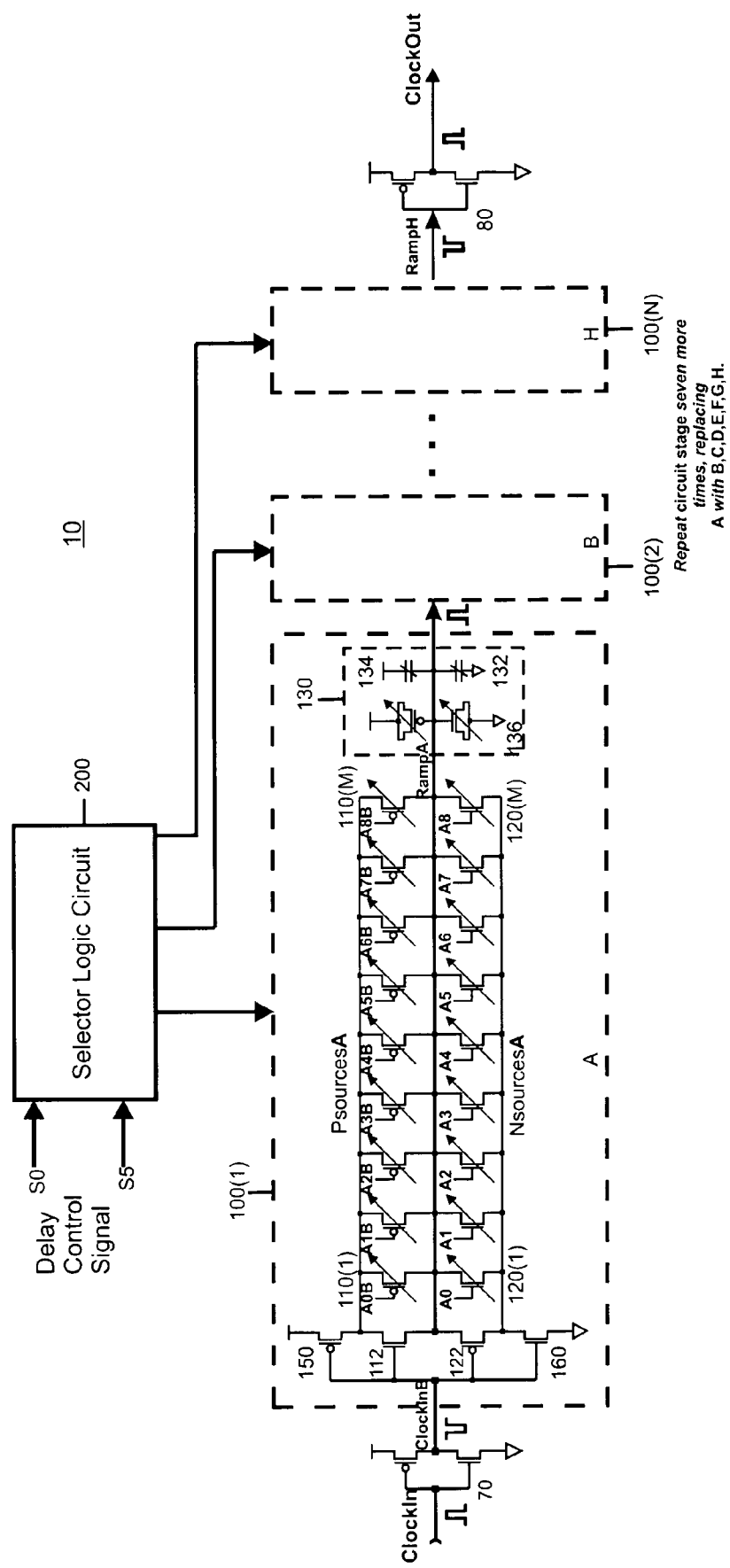
FIG. 1 is a schematic diagram of a phase adjustable digitally programmable delay circuit.

Referring first to FIG. 1, a phase adjustable digitally programmable delay circuit is shown at reference numeral 10. The delay circuit 10 comprises a plurality of transistor ladder circuit stages 100(1) to 100(N). The circuit stages 100(1) to 100(N) are either identical to each other, or substantially similar with minor differences as explained hereinafter. Only a single circuit stage 100(1) is shown in detail for simplicity. In the example described herein, there are 8 stages (N=8). The eight transistor ladder circuit stages are also labeled A through H in the figures for the N=8 case. A selector logic circuit 200 produces transistor selection signals that select and activate transistors in the circuit stages 100(1) to 100(N). The circuit stages 100(1) to 100(N) are connected in series with each other, and to a line carrying a signal having (rising and falling) edges to be delayed, referred to as ClockIn in FIG. 1.

There is an input driver circuit 70 comprising an inverter that receives the signal having edges to be delayed, referred to as ClockIn. Similarly, an output driver circuit 80 is provided that consists of an inverter to produce the phase adjusted output signal ClockOut. The delay circuit 10 delays both rising and falling edges of a signal, as indicated by the polarity symbol shown in FIG. 1 at various points in the circuit.

Each circuit stage 100(1) to 100(N) comprises a transistor ladder having a plurality of transistors 110(1) to 110(M) a first type (e.g., P-type) and a plurality of transistors 120(1) to 120(M) of a second type (e.g., N-type). In the example shown in FIG. 1, there are nine (M=9) P-type and N-type transistors, where transistor 110(1) corresponds to P-type transistor 0 and transistor 120(1) corresponds to N-type transistor 0, transistor 110(2) corresponds to P-type transistor 1 and transistor 120(2) corresponds to N-type transistor 1, and so on. Each of the P-type transistors 110(1) to 110(M) and N-type transistors 120(1) to 120(M) has a source, drain and gate. The sources of the P-type transistors 110(1) to 100(M) are connected to each other, and the sources of the N-type transistors 120(1) to 120(M) are connected to each other. On the other hand, the drains of both the P-type transistors 110(1) to 100(M) and N-type transistors 120(1) to 120(M) are connected together. As a result, each of the P-type transistors 110(1) to 110(M) are connected in parallel to each other and each of the N-type transistors 120(1) to 120(M) are connected in parallel to each other.

In each circuit stage there is a capacitive load 130 and switching transistors 150 and 160. The capacitive load 130 is connected between a node that is tied to the drains of the ladder transistors and a fixed potential. The capacitive load 130 comprises two metal trace capacitors 132 and 134, and an active capacitor 136. As is known in the art, an active capacitor comprises two transistors having their drains and sources shorted and their gates tied together. The active capacitor 136 contributes a relatively large degree of capacitance (per area) to the capacitive load 130 and is useful for tracking variations on the integrated circuit. For example, a ratio of the gate capacitance to wire capacitance of the active capacitor 136 may be set to match the tracking between the delay circuit and transistors of another circuit in the same integrated circuit.

The switching transistor 150 is connected between the commonly connected sources of the P-type transistors 110(1) to 110(M) and a power rail. The switching transistor 150 controls connection of the source of one or more of the P-type transistors 110(1) to 110(M) that have been selected to a power rail. Similarly, the switching transistor 160 is connected between the commonly connected sources of the N-type transistors 120(1) to 120(M) and ground. The switching transistor 160 controls connection of the source of one or more of the N-type transistors 120(1) to 120(M) that have been selected to ground.

Some of the P-type transistors 110(1) to 110(M) produce different delay amounts for an edge to be delayed through that circuit stage. Similarly, some of the N-type transistors 120(1) to 120(M) produce a different delay amount for the edge to be delayed through that circuit stage. The respective delay amounts of the P-type transistors and of the N-type transistors may span a desired delay range in equal (or unequal) steps. For example, P-type transistor 110(1) produces the least delay and transistor P-type 110(M) produces the most delay. Similarly, N-type transistor 120(1) produces the least delay and N-type transistor 120(M) produces the most delay.

To this end, some of the P-type and N-type transistors have different effective widths in order to produce a different delay amount when selected. The width of each individual ladder transistor is carefully set to a certain precision (e.g., the finest precision allowed by the particular foundry). The effective width of a transistor approximately sets the current it will source when activated ON, and hence how fast the transistor will charge the capacitive load.

Delay through each transistor ladder circuit is inversely proportional to the total transistor current, i.e., which is dependent on which transistors in the ladder sub-circuit are activated. Therefore, the delay amount difference (step or increment) between two transistors in a transistor ladder sub-circuit is the difference between the reciprocals of the effective width of each transistor. The effective widths of the transistors in each transistor ladder sub-circuit may be set such that the reciprocals of the effective widths of the transistors are equally or unequally spaced when spanning the corresponding delay range. The actual transistors differ substantially from the ideal because turn-ON is not instantaneous and the switch transistors have finite ON resistance.

In one embodiment, each of the plurality of P-type transistors 110(1) to 110(M) has a different effective width and thus produces a different delay amount when selected. Similarly, each of the plurality of N-type transistors 120(1) to 120(M0 has a different effective width and thus produces a different delay amount when selected.

In addition, in one embodiment, one and only one of the P-type transistors 110(1) to 110(M) in a circuit stage is ON at a given time; the rest are OFF. Similarly, one and only one of the N-type transistors 120(1) to 120(M) in a circuit stage is ON at a given time; the rest are OFF. Moreover, a transistor pair comprised of corresponding N-type and P-type transistors in a stage are selected together. For example, if N-type transistor 120(3) is selected, P-type transistor 110(3) is also selected. This is evident by the names of the transistor select signals A0-A8 for corresponding ones of the P-type transistors and A0B-A8B for corresponding ones of the N-type transistors. The "B" notation is meant to indicate "complement". In the subsequent circuit stages 110(2) through 110(8), the transistor select signals are called B0-B8 and B0B-B8B, C0-C8 and C0B-C8B, etc.

The overall delay imposed on an edge after it has passed through all of the circuit stages has delay contributions from both P-type and N-type transistors. Delay to an edge is imposed with both P-type and N-type transistors to better track process, voltage, and temperature conditions of the integrated circuit on which the delay circuit is implemented. However, at any given time within any particular circuit stage, a rising edge is delayed with a selected one or more P-type transistors 110(1) to 110(M) that are connected to the signal edge at the appropriate time by switching transistor 150. Similarly, within any particular circuit state, a falling edge is delayed with a selected one or more of the N-type transistors 120(1) to 120(M) that are connected to the signal edge at the appropriate time by switching transistor 160. While one or more P-type transistors and N-type transistors in a circuit stage are selected at the same time, they are not actually imposing delay on the same signal edge at the same time. Thus, the switching transistor 150 controls connection of the P-type transistor ladder to the signal when a rising edge is to be delayed by the circuit stage and the switching transistor 160 controls connection of the N-type transistor ladder to the signal when a falling edge is to be delayed by the circuit stage.

In each P-type transistor ladder there is an extra transistor 112 connected to one end, and in each N-type transistor ladder there is an extra transistor 122. The extra transistors 112 and 162 are reverse polarity of the rest of the ladder transistors. For example, transistor 112 is an N-type transistor connected at one end of the ladder of P-type transistors 110(1) to 110(M), and in parallel with the P-type transistors 110(1) to 110(M). Similarly, transistor 122 is a P-type transistor connected at one of the ladder of N-type transistors 120(1) to 160(M), and in parallel with the N-type transistors 120(1) to 160(M).

Transistors 112 and 122 are called "snubber" transistors. The purpose of the snubber transistors is to fully discharge the voltage across the corresponding transistor ladder during its inactive portion of the signal to be delayed. Otherwise, the voltage across a transistor ladder will only decay until it reaches threshold voltage and the busses marked PsourcesA and NsourcesA will be left floating for the rest of the cycle. For example, the snubber transistor 112 will discharge the voltage across the P-type transistors 110(1) to 110(M) during the low portion of the signal passing through that stage. Similarly, the snubber transistor 122 will discharge the voltage across the N-type transistors 120(1) to 120(M) during the high portion of the signal passing through that stage.

The selector logic circuit 200 is responsive to a delay control signal that consists of a delay select code, such as a six bit delay code S[5:0]. The selector logic circuit 200 decodes the delay select code to produce fine and coarse transistor selection bits. The selector logic circuit 200 also generates transistor select signals for the transistor ladders circuits in each circuit stage based on the fine and coarse transistor selection bits.

Figure 2:
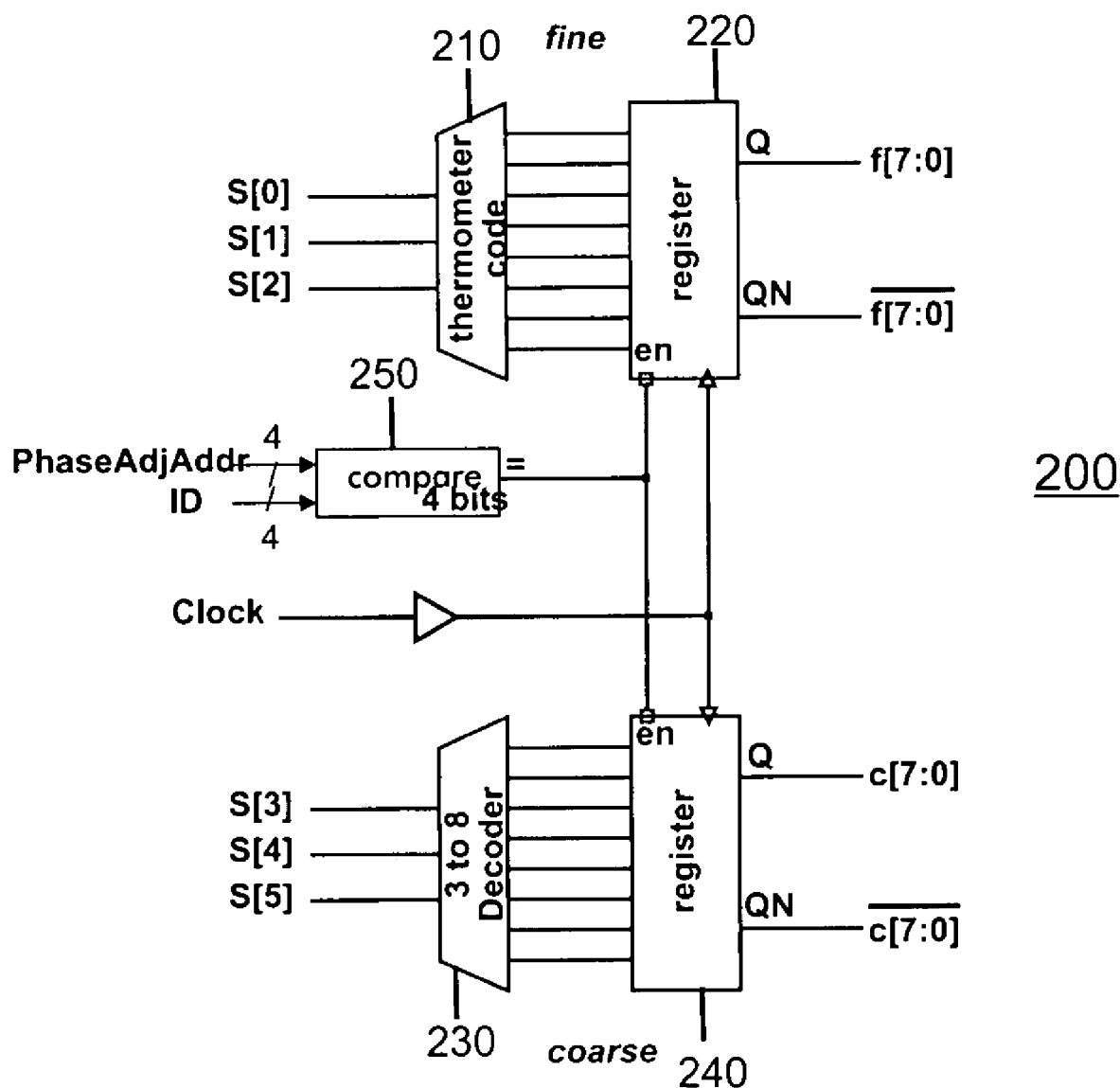
FIG. 2 is a block diagram of a selector logic circuit of the delay circuit shown in FIG. 1.

FIG. 2 illustrates the selector logic circuit 200 in more detail. The selector logic circuit 200 decodes a plurality of lower order delay select code bits, S[2:0], according to a thermometer coding scheme represented by the Boolean algebra expression set forth below to produce the fine selection bits f[7:0] and its complement. The higher order delay select code bits S[5:3] are decoded using an n-to-$2^n$ (e.g., 3-to-8) decoding scheme to produce the coarse selection bits c[7:0] and its complement.

Thermometer Code $f[0]=\overline{S[0]} \cdot \overline{S[1]} \cdot \overline{S[2]}$ $f[1]=\overline{S[1]} \cdot \overline{S[2]}$ $f[2]=(\overline{S[0]}+\overline{S[1]}) \cdot \overline{S[2]}$ $f[3]=\overline{S[2]}$ $f[4]=\overline{S[0]} \cdot \overline{S[1]}+\overline{S[2]}$ $f[5]=\overline{S[1] \cdot S[2]}$ $f[6]=\overline{S[0] \cdot S[1] \cdot S[2]}$ $f[7]=1$ The main characteristic of the thermometer code is that there can only be one polarity change along the column of zeros and ones. Each bit along the column represents one Least Significant Bit (LSB) in the system.

The selector logic circuit 200 comprises a thermometer decoder block 210 that performs the Boolean expression set forth above. The outputs of the thermometer decoder block 210 are coupled to a register 220. The outputs of the register are 16 bits corresponding to the fine selection bits f[7:0], and the complement of f[7:0]. For coarse selection, the selector logic circuit 200 comprises a 3-to-8 decoder 230 and a register 240. The outputs of the 3-to-8 decoder block 230 are coupled to the register 240. The register 240 outputs 16 bits corresponding to the coarse selection bits c[7:0] and the complement of c[7:0].

The selector logic circuit 200 computes the transistor select signals from the fine selection bits f[7:0] and coarse selection bits c[7:0] according to the Boolean expression set forth below.

Transistor Gate Decodes $Li=f[j] \cdot c[i]+\overline{f[j]} \cdot c[i-1]$ $LiB=f[j] \cdot \overline{c[j]}+\overline{f[j]} \cdot \overline{c[j-1]}$ 1. L stands for letters A thru H 2. j=0-7 corresponds to A-H.

3. $c[-1]=c[8]=0$.

Set forth below is table showing which P-N transistor pairs in each of the circuit stages 100(1) to 100(N) are selected according to the level (count or step) of the delay selection code S[5:0]. For example, when the count value corresponding to S[5:0] is 00, then transistor 110(1) and transistor 120(1), also denoted as P-type transistor 0 and N-type transistor 0, in each circuit stage is selected. P-type transistor 0 and N-type transistor 0 are the largest transistors in this scheme, imposing "zero" delay, but they nevertheless inherently have insertion delay. When S[5:0] is 01, then the P-type transistor 110(2) and the N-type transistor 120(2) are selected in the first circuit stage 100(1), or stage A. Further, when S[5:0] is 23, P-type transistor 110(4) and N-type transistor 120(4) are selected in each of the circuit stages 110(1) to 110(7), and in circuit stage 110(8) P-type transistor 110(3) and N-type transistor 120(3) are selected. Circuit stage 100(8) or stage H only uses eight of its nine transistors in each transistor ladder. As described above, while a transistor pair comprised of P-type and N-type transistors may be selected together in a circuit stage, the operate at different time intervals on different edges (i.e., rising and falling).

| select code value | stage | | | | | | | |
|---|---|---|---|---|---|---|---|---|
| | A | B | C | D | E | F | G | H |
| 00 | 0 | 0 | 0 | 0 | 0 | 0 | 0 | 0 |
| 01 | 1 | 0 | 0 | 0 | 0 | 0 | 0 | 0 |
| 02 | 1 | 1 | 0 | 0 | 0 | 0 | 0 | 0 |
| 03 | 1 | 1 | 1 | 0 | 0 | 0 | 0 | 0 |
| 04 | 1 | 1 | 1 | 1 | 0 | 0 | 0 | 0 |
| 05 | 1 | 1 | 1 | 1 | 1 | 0 | 0 | 0 |
| 06 | 1 | 1 | 1 | 1 | 1 | 1 | 0 | 0 |
| 07 | 1 | 1 | 1 | 1 | 1 | 1 | 1 | 0 |
| 08 | 1 | 1 | 1 | 1 | 1 | 1 | 1 | 1 |
| 09 | 2 | 1 | 1 | 1 | 1 | 1 | 1 | 1 |
| 10 | 2 | 2 | 1 | 1 | 1 | 1 | 1 | 1 |
| 11 | 2 | 2 | 2 | 1 | 1 | 1 | 1 | 1 |
| 12 | 2 | 2 | 2 | 2 | 1 | 1 | 1 | 1 |
| 13 | 2 | 2 | 2 | 2 | 2 | 1 | 1 | 1 |
| 14 | 2 | 2 | 2 | 2 | 2 | 2 | 1 | 1 |
| 15 | 2 | 2 | 2 | 2 | 2 | 2 | 2 | 1 |
| 16 | 2 | 2 | 2 | 2 | 2 | 2 | 2 | 2 |
| 17 | 3 | 2 | 2 | 2 | 2 | 2 | 2 | 2 |
| 18 | 3 | 3 | 2 | 2 | 2 | 2 | 2 | 2 |
| 19 | 3 | 3 | 3 | 2 | 2 | 2 | 2 | 2 |
| 20 | 3 | 3 | 3 | 3 | 2 | 2 | 2 | 2 |
| 21 | 3 | 3 | 3 | 3 | 3 | 2 | 2 | 2 |

-continued

| select code value | stage | | | | | | | |
|---|---|---|---|---|---|---|---|---|
| | A | B | C | D | E | F | G | H |
| 22 | 3 | 3 | 3 | 3 | 3 | 3 | 2 | 2 |
| 23 | 3 | 3 | 3 | 3 | 3 | 3 | 3 | 2 |
| 24 | 3 | 3 | 3 | 3 | 3 | 3 | 3 | 3 |
| 25 | 4 | 3 | 3 | 3 | 3 | 3 | 3 | 3 |
| 26 | 4 | 4 | 3 | 3 | 3 | 3 | 3 | 3 |
| 27 | 4 | 4 | 4 | 3 | 3 | 3 | 3 | 3 |
| 28 | 4 | 4 | 4 | 4 | 3 | 3 | 3 | 3 |
| 29 | 4 | 4 | 4 | 4 | 4 | 3 | 3 | 3 |
| 30 | 4 | 4 | 4 | 4 | 4 | 4 | 3 | 3 |
| 31 | 4 | 4 | 4 | 4 | 4 | 4 | 4 | 3 |
| 32 | 4 | 4 | 4 | 4 | 4 | 4 | 4 | 4 |
| 33 | 5 | 4 | 4 | 4 | 4 | 4 | 4 | 4 |
| 34 | 5 | 5 | 4 | 4 | 4 | 4 | 4 | 4 |
| 35 | 5 | 5 | 5 | 4 | 4 | 4 | 4 | 4 |
| 36 | 5 | 5 | 5 | 5 | 4 | 4 | 4 | 4 |
| 37 | 5 | 5 | 5 | 5 | 5 | 4 | 4 | 4 |
| 38 | 5 | 5 | 5 | 5 | 5 | 5 | 4 | 4 |
| 39 | 5 | 5 | 5 | 5 | 5 | 5 | 5 | 4 |
| 40 | 5 | 5 | 5 | 5 | 5 | 5 | 5 | 5 |
| 41 | 6 | 5 | 5 | 5 | 5 | 5 | 5 | 5 |
| 42 | 6 | 6 | 5 | 5 | 5 | 5 | 5 | 5 |
| 43 | 6 | 6 | 6 | 5 | 5 | 5 | 5 | 5 |
| 44 | 6 | 6 | 6 | 6 | 5 | 5 | 5 | 5 |
| 45 | 6 | 6 | 6 | 6 | 6 | 5 | 5 | 5 |
| 46 | 6 | 6 | 6 | 6 | 6 | 6 | 5 | 5 |
| 47 | 6 | 6 | 6 | 6 | 6 | 6 | 6 | 5 |
| 48 | 6 | 6 | 6 | 6 | 6 | 6 | 6 | 6 |
| 49 | 7 | 6 | 6 | 6 | 6 | 6 | 6 | 6 |
| 50 | 7 | 7 | 6 | 6 | 6 | 6 | 6 | 6 |
| 51 | 7 | 7 | 7 | 6 | 6 | 6 | 6 | 6 |
| 52 | 7 | 7 | 7 | 7 | 6 | 6 | 6 | 6 |
| 53 | 7 | 7 | 7 | 7 | 7 | 6 | 6 | 6 |
| 54 | 7 | 7 | 7 | 7 | 7 | 7 | 6 | 6 |
| 55 | 7 | 7 | 7 | 7 | 7 | 7 | 7 | 6 |
| 56 | 7 | 7 | 7 | 7 | 7 | 7 | 7 | 7 |
| 57 | 8 | 7 | 7 | 7 | 7 | 7 | 7 | 7 |
| 58 | 8 | 8 | 7 | 7 | 7 | 7 | 7 | 7 |
| 59 | 8 | 8 | 8 | 7 | 7 | 7 | 7 | 7 |
| 60 | 8 | 8 | 8 | 8 | 7 | 7 | 7 | 7 |
| 61 | 8 | 8 | 8 | 8 | 8 | 7 | 7 | 7 |
| 62 | 8 | 8 | 8 | 8 | 8 | 8 | 7 | 7 |
| 63 | 8 | 8 | 8 | 8 | 8 | 8 | 8 | 7 |

An important advantage of the thermometer code architecture is that each of the 63 levels (above 0) is associated one-to-one with a particular P-N transistor pair. For example, transistor pair 110(7) and 120(7) in circuit stage 110(3) is selected at delay select code value 51 and stays selected until the transistor pair 110(8) and 120(8) in circuit stage 110(3) is selected at delay select code 59. Thus, the selector logic circuit 200 generates transistor select signals for a particular transistor pair at each level of the delay select code such that there is a one-to-one association between a particular transistor pair and each level of the delay select code. This means that, in principle, "perfect" linearity can be achieved by adjusting each transistor pair individually based on simulations or actual chip measurements. Furthermore, the circuit topologies described herein have extremely good delay linearity by construction but are also extremely tunable to achieve that linearity in nearly any CMOS technology.

The delay select code scheme shown above is designed for a configuration where each of the circuit stages is the same with respect to transistor delay contribution. That is, the delay amounts produced by respective ones of the P-type transistors and the delay amounts produced by respective ones of the N-type transistors are substantially the same in each of the plurality of circuit stages so that each circuit stage is controllable to impose a similar adjustable amount of delay to an edge (rising edge in the case of P-type transistors and falling edge in the case of N-type transistors). Moreover, in each of the plurality of circuit stages, the delay amounts of the plurality of P-type transistors span in equal steps a delay range from a smallest delay amount to a largest delay amount and the delay amounts of the plurality of N-type transistors span in equal steps a delay range from a smallest delay amount to a greatest delay amount.

These Boolean expressions shown above can be economically implemented with a standard library element, the AOI22X2 in the Artisan digital logic design library, driving each calibrated transistor.

The delay circuit 10 achieves distributed delay control because of its high effective time-bandwidth product. For example, if the delay circuit 10 is to have a one nanosecond (ns) adjustment range, the full 1 ns should be available at the fastest process, temperature, voltage point called FF, to which it will track. Hence the delay circuit range is 2.5 ns at the slowest process-temperature-voltage point called SS. If the delay circuit has an insertion overhead of just 100%, the total propagation through the delay circuit can reach 5 ns. If this same delay circuit is to carry a 400 MHz square wave, it follows that as many as four edges, rising or falling, may be in transit in the circuit at a given time. Thus, the delay circuit 10 acts as a delay line.

Figure 3:
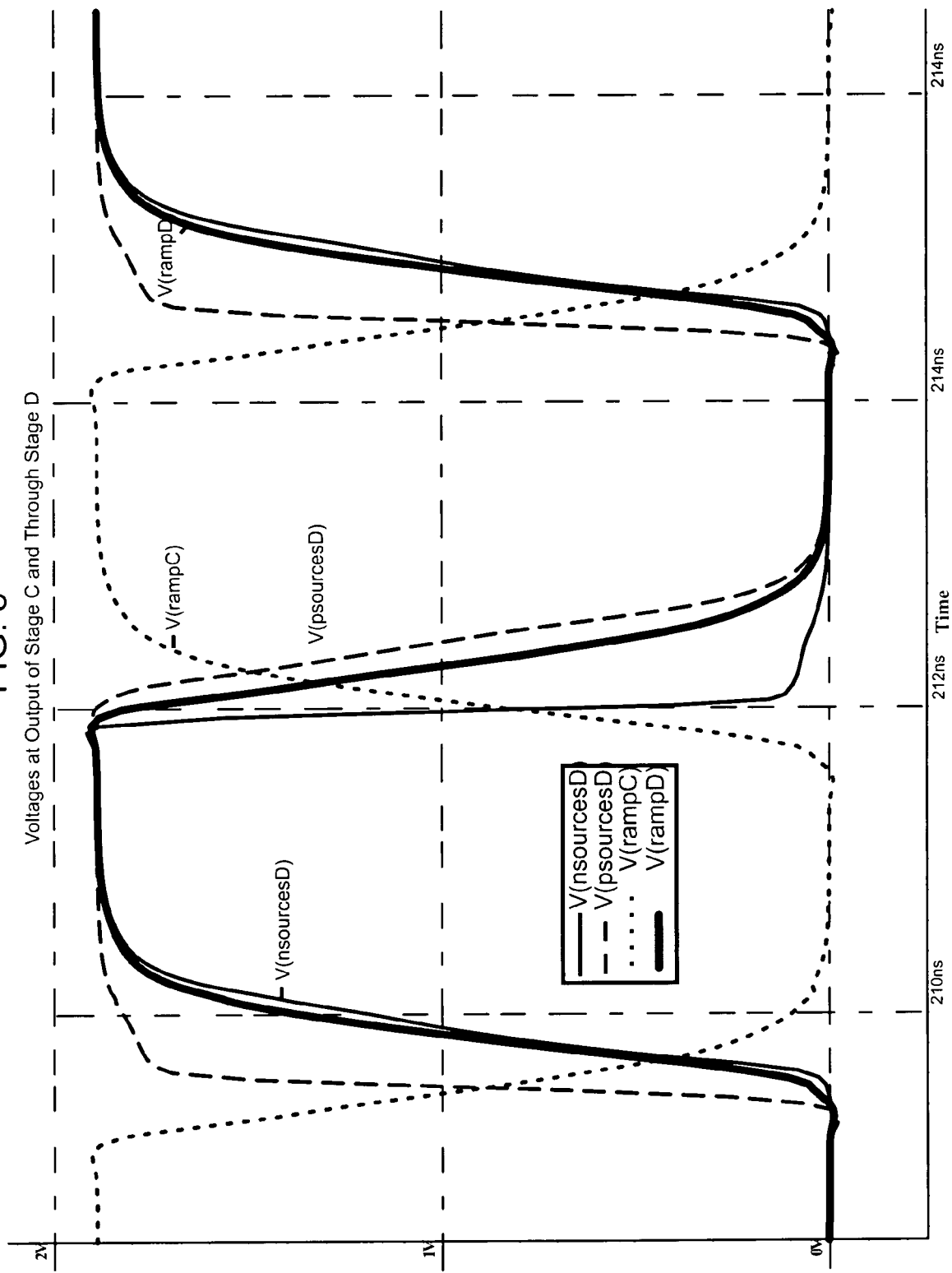
FIG. 3 is a plot resulting from a simulation and showing signals in two adjacent circuit stages of the delay circuit of FIG. 1.
Figure 4:
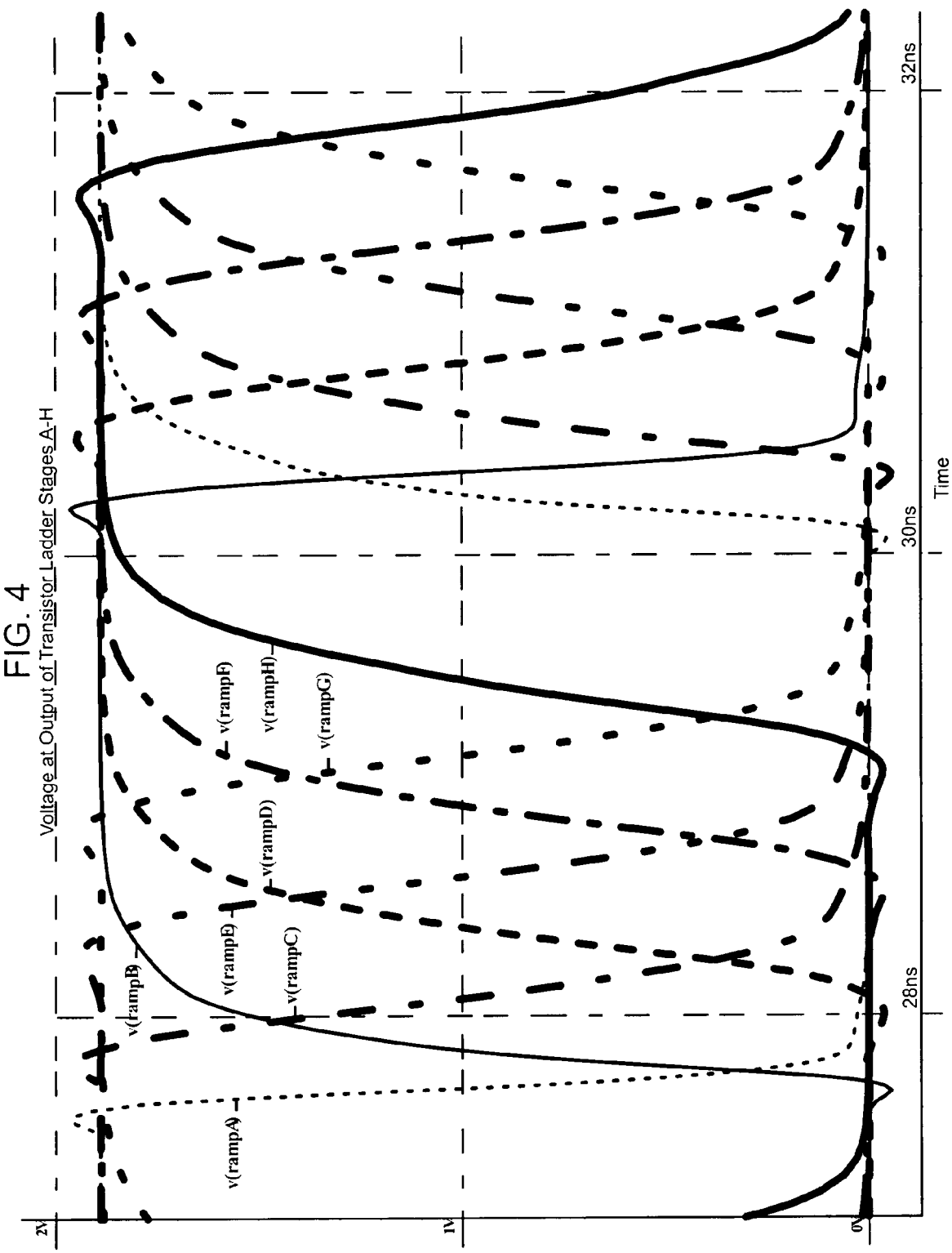
FIG. 4 is a plot resulting from a simulation and showing signals at the output of each of the circuit stages of the delay circuit shown in FIG. 1.

Reference is now made to FIGS. 3 and 4. FIG. 3 illustrates simulation plots of the voltage at various points in stages C and D when a 200 MHz signal is supplied as the clock signal to be delayed and the delay select code is at level 63, for a SS point. FIG. 4 illustrates simulations of the output voltage of stages A through H, under the same conditions.

As discussed earlier, the delay circuit 10 changes transistor selection while an edge is in transit because, at some frequencies, an edge is always in transit in at least one of the circuit stages. However, the delay circuit 10 needs to switch only one step at a time because of the gradual nature of temperature drift. Larger jumps can be short-stopped and doled out one step at a time by precursor logic. Nevertheless, precautions should be taken to prevent a traveling edge from coinciding with a transistor in a partially ON state.

One solution to this is inherent in the distributed delay architecture of the delay circuit 10. Incrementing the delay by one step involves just moving up or down one rung on one transistor ladder. (Two ladders are involved for the 128-step architecture described below.)

In one or all the circuit stages 100(1) to 100(N), one or more of the layout, transistor sizes, logic function and gate structures and their select circuits can be simulated and implemented to have one transistor (e.g., one P-type transistor) turning OFF (deselected) in unison (substantially the same time) with another transistor (e.g., another P-type transistor) turning ON (selected) so that an edge passing through a circuit stage is subject to some intermediary delay.

Figure 5:
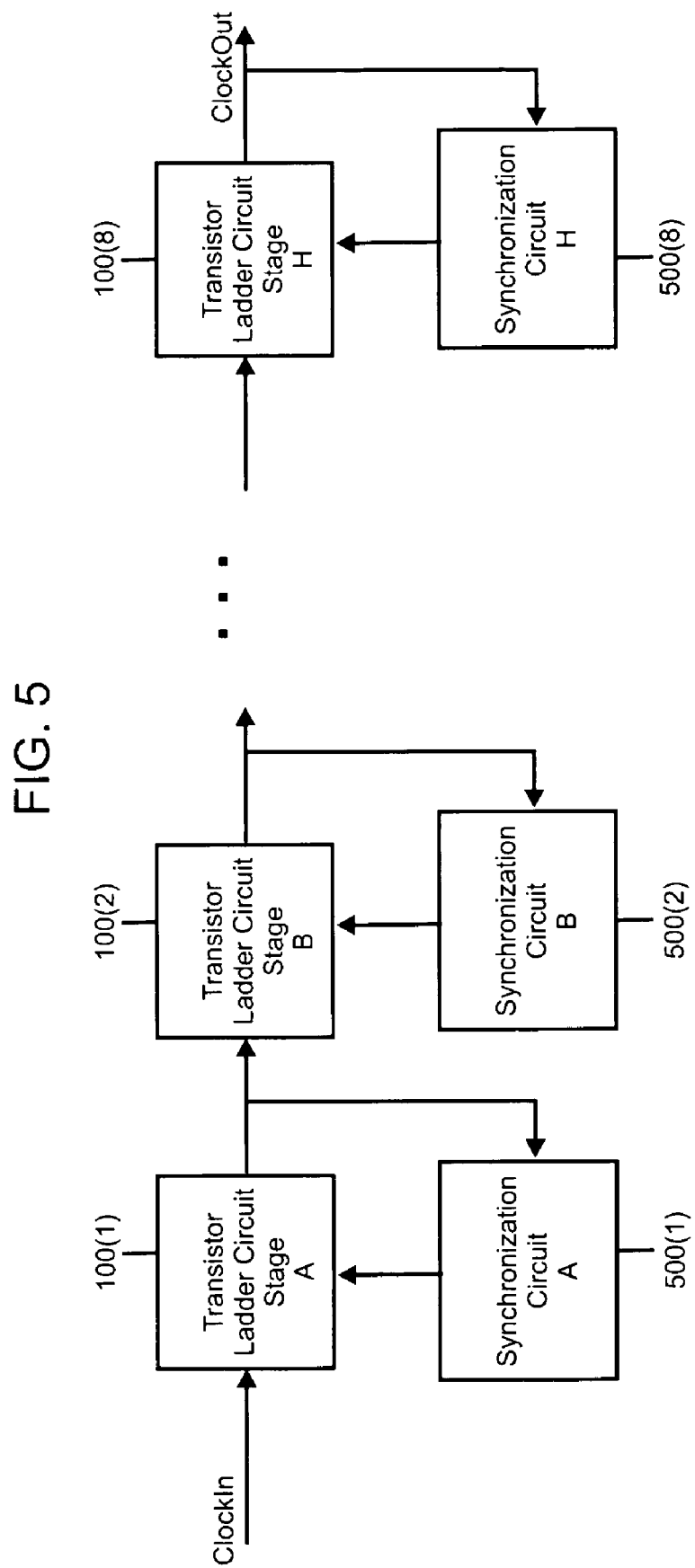
FIG. 5 is a block diagram showing an enhancement to the delay circuit shown in FIG. 1 to synchronize the activation of transistors in circuit stages.

A more sophisticated solution is "traveling wave switching." In this scenario, the switching of delay select code bits is resynchronized to the edge output at each circuit stage and timed to take place immediately after an edge has passed by. Since more than one edge may be in transit at once, multiple synchronizing stages and/or a crude delay line may be used to deliver control information to each circuit stage so that switching always occurs in the dead time between edges. An example of a synchronization arrangement is shown in FIG. 5. There is a synchronization circuit 500(1) to 500(8) for corresponding ones of the transistor ladder circuits 100(1) to 100(8), in an eight-stage configuration. Synchronization circuit 500(1) receives the output of the first circuit stage and detects when an edge occurs in that signal. Further, synchronization circuit 500(1) supplies a synchronized control signal to the circuit stage 100(1) that controls the switching of transistors in the circuit stage 100(1) so that switching occurs immediately after an edge is detected in the output signal of circuit stage 100(1). Similarly, synchronization circuit 500(2) receives as input signal the output of circuit stage 100(2) to detect when an edge occurs at the output of circuit stage 100(2) and supplies a synchronized control signal to circuit stage 100(2) that controls the switching of transistors in circuit stage 100(2) to ensure switching occurs after an edge is detected. The other synchronization circuits 500(3) to 500(8) operate in a similar manner. To summarize, there is a synchronization circuit associated with each circuit stage. Each synchronization circuit receives as input the output signal of its associated circuit stage to detect occurrence of an edge in the output signal and supplies a synchronized control signal to the associated circuit stage to ensure that transistor selection in the associated circuit stage occurs during a time interval between edges.

It should be understood that a single synchronization circuit may be shared among multiple circuit stages so that, for example, only four synchronization circuits are needed for eight circuit stages. In this case, synchronization is not invoked at every circuit stage, but perhaps every other stage. Thus, generally speaking a synchronization circuit is provided that is associated with one or more circuit stages, wherein each synchronization circuit receives a output signal from an associated circuit stage to detect occurrence of an edge in the signal and supplies a synchronized control signal to the one or more associated circuit stages to ensure that transistor selection in those associated circuit stages occurs during a time interval between edges. Moreover, it is possible to provide a similar synchronization scheme, but using the input to a circuit stage (rather than the output) for detecting an edge as the synchronization trigger.

The coding scheme described is one of many possibilities, albeit likely the simplest. One important option is a hybrid that includes some degree of course/fine hierarchy within the basic distributed-delay paradigm. In this case, each of the plurality of circuit stages are not identical, but are very similar.

As an example, a seventh address bit is added, S[6], for a total of 128 delay steps, without increasing the number of calibrated transistors. The matrix below on the left represents the 64 steps described above, while the matrix on the right shows a modified arrangement that achieves 128 steps while maintaining approximately equal partitioning of delay among the eight circuit stages.

The numbers in the respective matrices are the delay through the listed stage, A through H, for each of the nine (P-type and N-type) transistors in each stage. It should be understood that the numbers in the matrices are for each P-type and corresponding N-type of a transistor pair, but for simplicity this explanation refers to it in terms of a "transistor". The delays are relative to the delay of the fastest transistor, transistor 0, which is taken as zero delay. For example, the matrix on the left indicates that transistor 2 in stage A imposes a full delay unit step more delay than transistor 1 in stage A, transistor 3 imposes a full step more delay than transistor 2, and so on. The units are "one step" where 63 or 63/1;2 steps are the total delay range (maximum delay minus minimum delay) for a given delay circuit design.

| transistor | A | B | C | D | E | F | G | H | transistor | A | B | C | D | E | F | G | H |
|---|---|---|---|---|---|---|---|---|---|---|---|---|---|---|---|---|---|
|  |  |  |  | delay |  |  |  |  |  |  |  |  | delay |  |  |  |  |
| 8 | 8 | 8 | 8 | 8 | 8 | 8 | 8 | 8 | 8 | 8 | 8 | 8 | 8 | 8 | 8 | 8 | 7½ |
| 7 | 7 | 7 | 7 | 7 | 7 | 7 | 7 | 7 | 7 | 7 | 7 | 7 | 7 | 7 | 7 | 6½ | 7 |
| 6 | 6 | 6 | 6 | 6 | 6 | 6 | 6 | 6 | 6 | 6 | 6 | 6 | 6 | 6 | 5½ | 6 | 6 |
| 5 | 5 | 5 | 5 | 5 | 5 | 5 | 5 | 5 | 5 | 5 | 5 | 5 | 5 | 4½ | 5 | 5 | 5 |
| 4 | 4 | 4 | 4 | 4 | 4 | 4 | 4 | 4 | 4 | 4 | 4 | 4 | 3½ | 4 | 4 | 4 | 4 |
| 3 | 3 | 3 | 3 | 3 | 3 | 3 | 3 | 3 | 3 | 3 | 3 | 2½ | 3 | 3 | 3 | 3 | 3 |
| 2 | 2 | 2 | 2 | 2 | 2 | 2 | 2 | 2 | 2 | 2 | 1½ | 2 | 2 | 2 | 2 | 2 | 2 |
| 1 | 1 | 1 | 1 | 1 | 1 | 1 | 1 | 1 | 1 | ½ | 1 | 1 | 1 | 1 | 1 | 1 | 1 |
| 0 | 0 | 0 | 0 | 0 | 0 | 0 | 0 | 0 | 0 | 0 | 0 | 0 | 0 | 0 | 0 | 0 | 0 |
|  |  |  |  | 64 steps |  |  |  |  |  |  |  |  | 128 half-steps |  |  |  |  |

For the 128-step matrix on the right, the circuit stages are not identical. In stage A, transistor 1 produces ½ delay units as compared to transistor 1 in stage A of the 64-step matrix on the left. Transistors 0 and 2-8 in stage A are the same as in the 64-step version. In stage B, transistor 2 produces 1½ delay units as opposed to 2 delay units in the 64-step version, and transistors 0 and 3-8 are the same as the 64-step version. This pattern continues so that a half-step offset is provided on a progressively greater delay transistor in the circuit stages.

Thus, with this coding scheme, the delay amounts produced by respective ones of the plurality of P-type transistors and the delay amounts produced by respective ones of the plurality of N-type transistors are not the same in some (and in one case, each) of the plurality of circuit stages so that some (and in one case, each) circuit stages are controllable to impose a different adjustable amount of delay to an edge that is coupled as input thereto. Moreover, in each of the plurality of circuit stages, except for a particular P-type transistor, the delay amounts of the plurality of P-type transistors span in equal steps a delay range from a smallest delay amount to a largest delay amount. Similarly, except for a particular N-type transistor, the delay amounts of the plurality of N-type transistors of span in equal steps a delay range from a smallest delay amount to a greatest delay amount. The particular P-type transistor and particular N-type transistor that establishes the different step is different across the circuit stages at progressively greater delay positions in the range, as shown in the matrix on the right. The step between the delay amount of the particular P-type transistor and the next greater delay amount P-type transistor is 1½ of the step between other consecutive delay amount P-type transistors in each circuit stage. The step between the delay amount of the particular P-type transistor and the next greater delay amount P-type transistor is ½ of the step between other consecutive delay amount P-type transistors in each circuit stage. The same step difference relationship holds for the particular N-type transistor in the circuit stages.

The decode logic for the 128-step variation may be implemented to maintain approximately equal per-stage delay by selecting transistors to implement a given code from at most two adjacent rows in the matrix.

Figure 6:
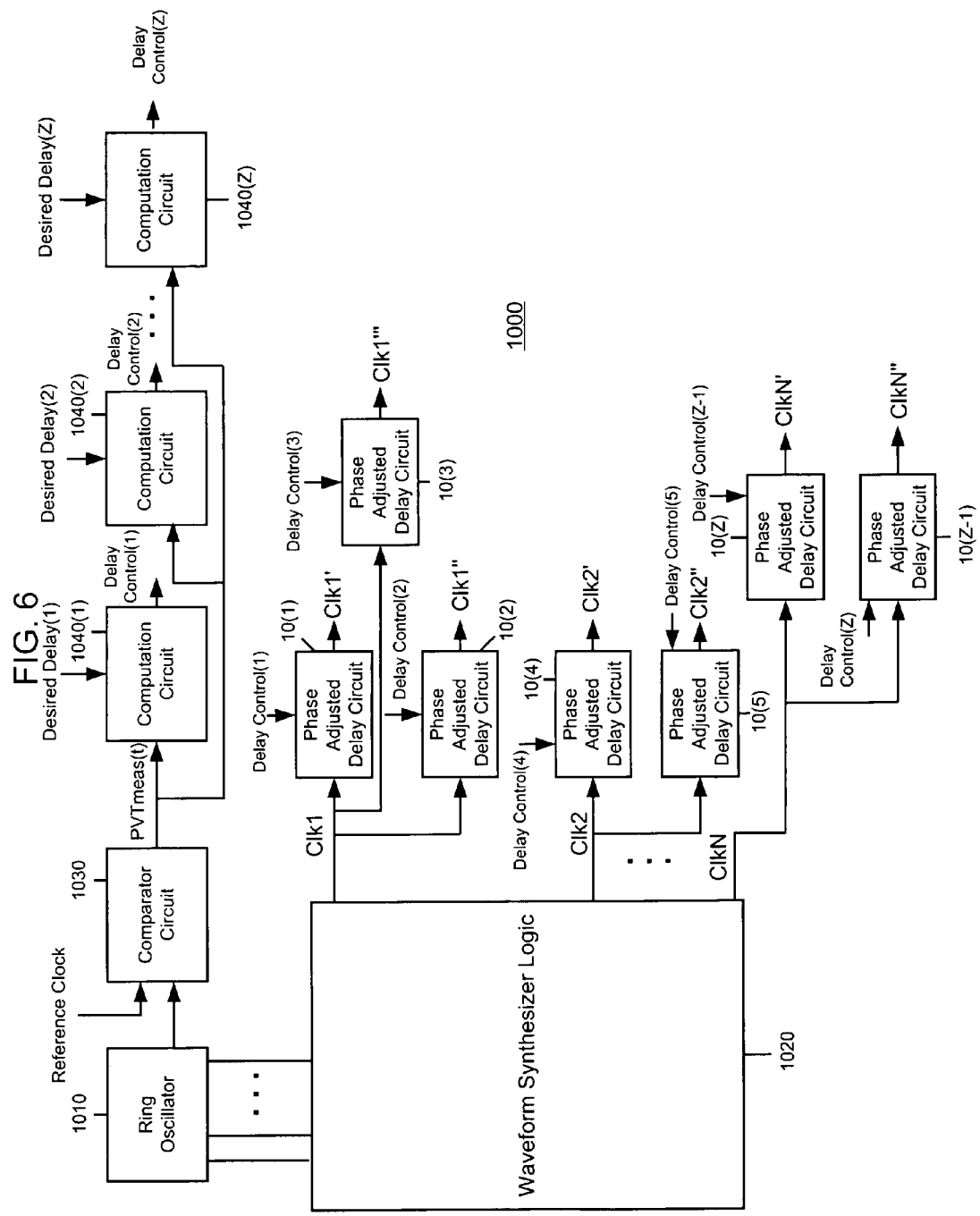
FIG. 6 is a block diagram of a central clock system that is in an integrated circuit and used to supply one or more clock signals to various points on a circuit board.
Figure 7:
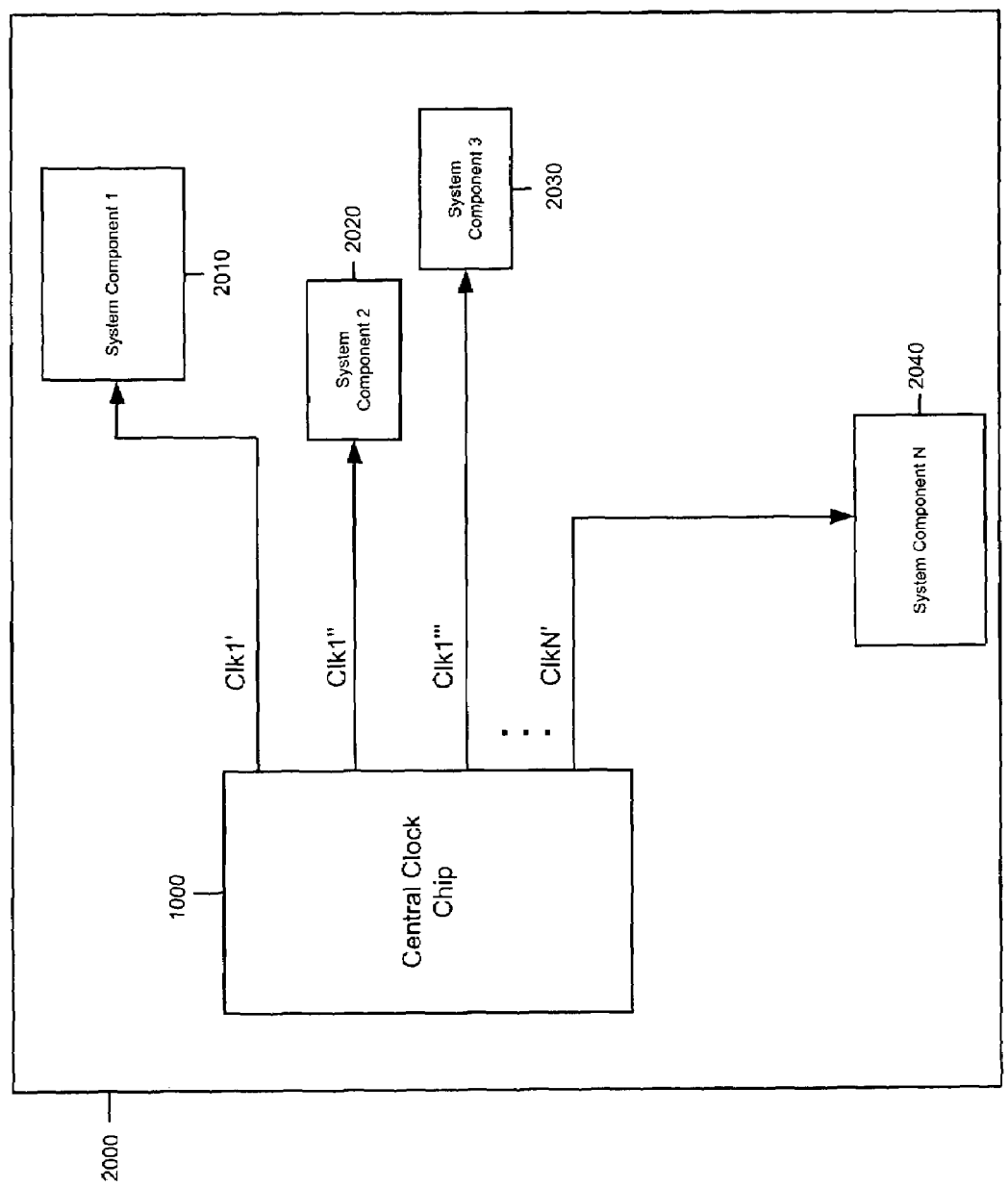
FIG. 7 is a block diagram showing distribution of the phase adjusted clock signal is made to multiple circuit board points so that the clock signal arrives synchronously at each point.

FIGS. 6 and 7 illustrate a technique to digitally adjust on-chip the phases of a clock signal at the source in order to synchronize the clock signal when distributed to multiple points on a circuit board. For example, a single clock signal may be output on eight pins with the phase at each pin separately adjustable under digital control by a delay circuit of the type described in connection with FIGS. 1-4. During board power-up, the desired delays amounts are downloaded to the clock chip. The delay adjustment range for a delay circuit may be one nanosecond, representing approximately six inches of printed-circuit trace length. Consequently, circuit board area is conserved allowing for reducing overall circuit board dimensions. In addition, the circuit board can be debugged after circuit board assembly and synchronization of the clock signals digitally adjusted by changing the delay values. FIG. 6 illustrates a central clock chip 1000 that is implemented in a single integrated circuit. The central clock chip 1000 comprises a ring oscillator circuit 1010, waveform synthesizer logic 1020 and a comparator circuit 1030. These three elements are more thoroughly described in commonly assigned U.S. Pat. Nos. 6,377,094 and 6,664,832, entitled "Arbitrary Waveform Synthesizer Using a Free-Running Oscillator." These patents disclose a digitally controlled arbitrary waveform synthesizer having a ring oscillator that provides a short-term stable time reference. A plurality of taps are provided to select edges (transitions) produced by the ring oscillator. The waveform synthesizer logic 1020 comprises numerous other circuits that are fully described in the aforementioned patents. The waveform synthesizer logic 1020 produces as output a plurality of clock signals Clk1 to ClkN.

The ring oscillator circuit 1010 is connected to the comparator circuit 1030 that also receives as input a reference clock signal (such as a signal from a crystal). The comparator circuit 1030 compares a speed of the ring oscillator circuit 1010 with the reference signal and generates a tracking value PVTmeas(t) that is a measure of the instantaneous process, voltage and temperature (PVT) conditions of the integrated circuit in which the system 1000 is implemented.

Through simulations made during circuit board system design, the desired delay required for a particular clock signal is determined based on its destination point and path on the circuit board. These delay values are then loaded onto the clock chip 1000 and are represented as desired delay(1) to desired delay(Z). There is a desired delay value for each clock signal path for a clock signal, where desired delay(1) is for delay circuit 10(1), desired delay(2) is for delay circuit 10(2) and so on. For each clock signal destination, there is a computation circuit 1040(1) to 1040(Z). The computation circuits 1040(1) to 1040(Z) receive as input PVTmeas(t) produced by the comparator circuit 1030 and a corresponding desired delay value. The computation circuits 1040(1) to 1040(Z) generate delay control signals(1) to (Z) based on PVTmeas(t) and the corresponding desired delay value(1) to (Z).

Each delay control signal(1) to( Z) is coupled to a corresponding one of the delay circuits 10(1) to 1O(Z). For example, there are three destinations for clock signal Clk1 and delay circuits 10(1), 10(2) and 10(3) are connected to clock signal Clk1. There are two destinations for clock signal Clk2 so there are delay circuits 10(4) and 10(5) connected to clock signal Clk2. And there are two destinations for clock signal ClkN so there are delay circuits 10(Z-1) and 10(Z) connected to it.

By comparing the ring oscillator circuit speed to a reference signal, a highly accurate measurement is made on the ring oscillator circuit speed. The speed of the ring oscillator circuit 1010 varies with PVTmeas(t). Therefore, this measurement yields a slowly varying binary number (called average loop speed in the aforementioned patents) that is a measure of the instantaneous PVT conditions in the IC in which the system is deployed. The computation circuits 1040(1) to 1040(Z) each perform binary multiplication based on PVTmeas(t) to convert a corresponding one of the desired delays(1) to (Z) into the delay control signal(1) to (Z) that controls the transistor selections in the corresponding delay circuit to impose the desired phase adjustment to that clock signal using the techniques described above in conjunction with FIGS. 1-4. Moreover, correction is made at the delay circuit for any tracking error caused by changing PVT conditions of the integrated circuit.

Delay circuit 10(1) is responsive to delay control signal(1) and imposes a phase adjustment to clock signal Clk1 to produce clock signal Clk1'. Delay circuit 10(2) is responsive to delay control signal(2) and imposes a phase adjustment to clock signal Clk1 and produces clock signal Clk1". Finally, delay circuit 10(3) is responsive to delay control signal(3) and imposes a phase adjustment to clock signal Clk1 to produce clock signal Clk1'". Similar is true for delay circuits 10(4) and 10(5) with respect to clock signal Clk2 and delay circuits 10(Z-1) and 10(Z) with respect to clock signal ClkN.

FIG. 7 illustrates how the various phase adjusted clock signals shown in FIG. 5 are coupled to a corresponding destination system component 2010, 2020, 2030 and 2040 on a circuit board 2000. For example, clock signal Clk1 is phase adjusted three different ways for connection to system component 2010, system component 2020 and system component 2030 so that it arrives synchronously at these three components. These components may be, for example, a processor, a memory controller and a bus controller, respectively, all driven by the same clock signal Clk1 that is phase adjusted to compensate for their locations on the circuit board.

The delay circuit techniques described herein of using a single transistor in a bank of many transistors with individual selects delivers an unprecedented level of granularity (down to a handful of picoseconds) on a waveform edge. Providing picoseconds levels of programmable delay adjustability is extremely difficult yet virtually required as fabrication technologies advance.

The PVT tracking techniques described herein have a further application. One of the problems as semiconductor fabrication technologies go from 90 nm to 65 nm is a long term drift of P-type and N-type device thresholds. This is a different cause/effect than the PVT characteristics of an integrated circuit chip at the time it comes out of fabrication. The techniques described herein of passing a specific rising/falling edge through banks of sized P-type and N-type devices to track process, temperature, and voltage variations will also serve to track long term P-type and N-type threshold drifts.

To summarize, a digitally programmable delay circuit is provided comprising a plurality of circuit stages connected in series with each other. A first circuit stage being coupled to a line carrying a signal having edges to be delayed. Each circuit stage comprises a plurality of transistors of a first type (e.g., P-type) connected in parallel with each other, and a plurality of transistors of a second type (e.g., N-type) connected in parallel with each other. In response to a delay control signal, one or more of the plurality of transistors of the first type are selected in each circuit stage to delay an edge of a first type (e.g., a rising edge) and one or more of the plurality of transistors of a second type are selected in each circuit stage to delay an edge of a second type (e.g., a falling edge). The delay control signal is based on a desired delay amount and a measure of instantaneous process, voltage and temperature conditions of an integrated circuit in which the plurality of transistors are implemented.

The delay circuit may be combined, in an integrated circuit, with a ring oscillator circuit, comparator circuit and computation circuit. The ring oscillator circuit generates a plurality of uniquely phased oscillator transition signals from which a clock signal is generated. The comparator circuit is coupled to the ring oscillator circuit and compares a speed of the ring oscillator circuit with a reference signal to generate a tracking value that is a measure of the instantaneous process, voltage and temperature conditions of the integrated circuit. The computation circuit is coupled to the comparator circuit and generates the delay control signal based on the tracking value and the desired delay amount.

Similarly, a clock signal generation system implemented in an integrated circuit may be provided that includes a plurality of the delay circuits and a ring oscillator circuit, waveform synthesizer logic, a comparator circuit and a plurality of computation circuits. The ring oscillator circuit generates a plurality of uniquely phased oscillator transition signals from which at least one clock signal is generated. The waveform synthesizer logic circuitry coupled to the ring oscillator circuit that generates the at least one clock signal at a desired frequency to be supplied to a plurality of points on a circuit board. The comparator circuit is coupled to the ring oscillator circuit and compares a speed of the ring oscillator circuit with a reference signal to generate a tracking value that is a measure of the instantaneous process, voltage and temperature conditions of the integrated circuit. Each computation circuit is coupled to the comparator circuit and receives as input a desired delay value that synchronizes arrival of the clock signal at a corresponding one of the points on the circuit board with respect to each of the plurality of points on the circuit board, wherein the computation circuit generates a delay control signal for a corresponding delay circuit based on the tracking value and the desired delay value. Each of the plurality of delay circuits is coupled to receive the clock signal as the clock signal to be delayed, and each delay circuit delays edges of the clock signal in response to the delay control signal produced by an associated computation circuit.

Furthermore, an integrated circuit for supplying clock signals (e.g., a "clock chip") is provided comprising clock signal circuitry that produces at least one clock signal to be distributed to a plurality of points on a circuit board; and a plurality of digitally programmed delay circuits each of which delays the clock signal by a desired delay amount so as to synchronize arrival of the clock signal when distributed to each of the plurality of points on the circuit board.

Similarly, a method is provided of distributing a clock signal to each of a plurality of points on a circuit board comprising delaying the clock signal with a digitally programmable delay circuit by a respective amount for each of the paths to the plurality of points so as to synchronize arrival of the clock signal at each of the plurality of points on the circuit board. Edges of the clock signal are delayed by a respective amount for each destination on the circuit board to compensate for the different distances the clock signal will travel to each circuit board point. Moreover, the edges of the clock signal are delayed in the integrated circuit that produces the clock signal prior to distribution on the circuit board to the plurality of points.

Still further, a digitally programmable delay circuit is provide comprising a plurality of circuit stages, a first of which being connected to a line carrying a signal having edges to be delayed. Each circuit stage comprises a plurality of transistors of a first type (e.g., P-type) connected in parallel with each other and a plurality of transistors of a second type (e.g., N-type) connected in parallel with each other. In each of the plurality of circuit stages, some of the plurality of transistors of the first type produce a different delay amount (for a rising edge) when selected, and some of the plurality of transistors of the second type produce a different delay amount (for a falling edge) when selected. A transistor pair comprising one of the transistors of the first type and one of the transistors of the second type is selected in each circuit stage.

Further yet, a method of delaying edges of a signal is provided comprising coupling edges of the signal to a plurality of transistor ladder circuit stages connected in series with each other; and selecting one or more transistors of a first type in each circuit stage to adjust an amount of delay imposed to a rising edge, and selecting one or more transistors of a second type in each circuit.

The above description is intended by way of example only.

What is claimed is:

1. A digitally programmable delay circuit comprising a plurality of circuit stages connected in series with each other, a first circuit stage being coupled to a line carrying a signal having edges to be delayed, each circuit stage comprising a plurality of P-type transistors of connected in parallel with each other, and a plurality of N-type transistors connected in parallel with each other, and a selector circuit that is responsive to a delay control signal and selects one or more of the plurality of P-type transistors in each circuit stage to delay a rising edge of the signal and one or more of the plurality of N-type transistors in each circuit stage to delay a falling edge of the signal, an N-type transistor connected in parallel with the plurality of P-type transistors that discharges voltage across the plurality of P-type transistors during a low portion of the signal, and a P-type transistor connected in parallel with the plurality of N-type transistors that discharges voltage across the plurality of N-type transistors during a high portion of the signal, wherein the delay control signal is based on a desired delay amount and a measure of instantaneous process, voltage and temperature conditions of an integrated circuit in which the plurality of transistors are implemented.

2. The circuit of claim 1, wherein the delay amounts produced by respective ones of the plurality of P-type transistors and the delay amounts produced by respective ones of the plurality of N-type transistors are substantially the same in each of the plurality of circuit stages so that each circuit stage is controllable to impose a similar adjustable amount of delay to an edge that is coupled as input thereto.

3. The circuit of claim 2, wherein in each of the plurality of circuit stages, some of the plurality of P-type transistors produce different delay amounts when selected and some of the plurality of N-type transistors produce different delay amounts when selected.

4. The circuit of claim 2, wherein in each of the plurality of circuit stages, each of the plurality of P-type transistors produces a different delay amount when selected, and each of the plurality of N-type transistors produces a different delay amount when selected.

5. The circuit of claim 4, wherein in each of the plurality of circuit stages, the delay amounts of the plurality of P-type transistors span in equal steps a delay range from a smallest delay amount to a largest delay amount and the delay amounts of the plurality of N-type transistors span in equal steps a delay range from a smallest delay amount to a greatest delay amount.

6. The circuit of claim 1, wherein the delay amounts produced by respective ones of the plurality of P-type transistors and the delay amounts produced by respective ones of the plurality of N-type transistors are not the same in some of the plurality of circuit stages so that some circuit stages are controllable to impose a different adjustable amount of delay to an edge that is coupled as input thereto.

7. The circuit of claim 6, wherein in each of the plurality of circuit stages, some of the plurality of P-type transistors produce different delay amounts when selected and some of the plurality of N-type transistors produce different delay amounts when selected.

8. The circuit of claim 6, wherein in each of the plurality of circuit stages, each of the plurality of P-type transistors produces a different delay amount when selected, and each of the plurality of N-type transistors produces a different delay amount when selected.

9. The circuit of claim 8, wherein in each of the plurality of circuit stages, except for a particular P-type transistor the delay amounts of the plurality of P-type transistors span in equal steps a delay range from a smallest delay amount to a largest delay amount, and except for a particular N-type transistor the delay amounts of the plurality of N-type transistors span in equal steps a delay range from a smallest delay amount to a greatest delay amount.

10. The circuit of claim 9, wherein said particular P-type transistor and said particular N-type transistor are different across the circuit stages at progressively greater delay positions in the range.

11. The circuit of claim 10, wherein a step between the delay amount of said particular P-type transistor and the delay amount of the P-type transistor producing the next greater delay amount is one and one-half of the step between other consecutive delay amount transistors of the first type in each circuit stage, and a step between the delay amount of said particular P-type transistor and the delay amount of the P-type transistor producing the next smaller delay amount is one-half of the step between other consecutive delay amount P-type transistors in each circuit stage, and wherein a step between the delay amount of said particular N-type transistor and the delay amount of the N-type transistor producing the next greater delay amount is one and one-half of the step between other consecutive delay amount N-type transistors in each circuit stage, and a step between the delay amount of said particular N-type transistor and the delay amount of the N-type transistor producing the next smaller delay amount is one-half of the step between other consecutive delay amount N-type transistors in each circuit stage.

12. The circuit of claim 1, wherein in each of the plurality of circuit stages, some of the plurality of P-type transistors produce a different delay amount when selected, and some of the plurality of N-type transistors produce a different delay amount when selected.

13. The circuit of claim 1, wherein one or more of the layout, size, logic function and gate structures of the plurality of P-type transistors and their select circuits are implemented in the integrated circuit so that one of the plurality of P-type transistors is deselected at the substantially the same time another of the plurality of P-type transistors is selected.

14. The circuit of claim 1, wherein one or more of the layout, size, logic function and gate structures of the plurality of N-type transistors and their select circuits are implemented in the integrated circuit so that one of the plurality of N-type transistors is deselected at the substantially the same time another of the plurality of N-type transistors is selected.

15. The circuit of claim 1, wherein in each circuit stage, a transistor pair comprising one of the plurality of P-type transistors and one of the plurality of N-type transistors is selected at any time in response to the delay control signal.

16. The circuit of claim 1, and further comprising a first switching transistor and a second switching transistor, the first switching transistor connected between a commonly connected terminal of each of the plurality of P-type transistors and a power rail, wherein the first switching transistor controls connection of one or more of the plurality of P-type transistors that have been selected to the power rail, the second switching transistor connected between a commonly connected terminal of each of the plurality of N-transistors and ground, wherein the second switching transistor controls connection of one or more of the plurality of N-type transistors that have been selected to ground.

17. The circuit of claim 1, wherein the selector circuit receives as input the delay control signal and generates transistor select signals to activate one or more P-type transistors and N-type transistors in each circuit stage.

18. The circuit of claim 17, wherein the delay control signal comprises a delay select code comprising a plurality of bits, and the selector circuit decodes the delay control code to generate fine selection bits and coarse selection bits, and wherein selection of one or more N-type transistors and P-type transistors in each of the circuit stages is based on one or more of the fine selection bits and one or more of the coarse selection bits.

19. The circuit of claim 17, wherein the selector circuit generates transistor select signals for a particular transistor pair comprising a P-type transistor and an N-type transistor at each level of the delay select code such that there is a one-to-one association between a particular transistor pair and each level of the delay select code.

20. The circuit of claim 1, the selector circuit is responsive to a delay select code representing a plurality of selection levels each of which corresponds to a particular transistor pair comprising one of the plurality of transistors of the first type and one of the plurality of transistors of the second type, such that there is a one-to-one association between a particular transistor pair and each level of the delay select code.

21. A digitally programmable delay circuit comprising:
  a. a plurality of circuit stages connected in series with each other, and a first circuit stage being coupled to a line carrying a signal having edges to be delayed, each circuit stage comprising a plurality of transistors of a first type connected in parallel with each other and a plurality of transistors of a second type connected in parallel with each other, wherein in each of the plurality of circuit stages, some of the plurality of transistors of the first type produce different delay amounts when selected and some of the plurality of transistors of the second type produce different delay amounts when selected;
  b. a selector circuit that is responsive to a delay select code to generate transistor select signals that select a transistor pair comprising a transistor of the first type and a transistor of the second type at each level of the delay select code such that there is a one-to-one association between a particular transistor pair and each level of the delay select code, wherein the selector circuit selects, in each circuit stage, one of the plurality of transistors of the first type to delay a rising edge of the signal and one of the plurality of transistors of the second type to delay a falling edge of the signal; and c. a synchronization circuit associated with one or more circuit stages, wherein each synchronization circuit receives a signal from an associated circuit stage to detect occurrence of an edge and supplies a synchronized control signal to the one or more associated circuit stages to ensure that transistor selection in the associated circuit stages occurs during a time interval between edges.

22. A method for delaying edges of a signal comprising:

a. coupling edges of the signal to a plurality of transistor ladder circuit stages connected in series with each other; and b. selecting one or more transistors of a first type in each circuit stage to adjust an amount of delay imposed to a rising edge, and selecting one or more transistors of a second type in each circuit stage to adjust an amount of delay imposed to a falling edge; and c. detecting occurrence of an edge in each transistor ladder circuit stage and supplying a synchronized control to one or more transistor ladder circuit stages in order to ensure that transistor selection in the one or more transistor ladder circuit stages occurs during a time interval between edges.

23. The method of claim 22, wherein selecting comprises selecting a particular transistor pair comprising one of the transistors of the first type and one of the transistors of the second type in each circuit stage.

24. A digitally programmable delay circuit comprising a plurality of circuit stages connected in series with each other, a first circuit stage being coupled to a line carrying a signal having edges to be delayed, each circuit stage comprising a plurality of P-type transistors of connected in parallel with each other, and a plurality of N-type transistors connected in parallel with each other, and a selector circuit that is responsive to a delay control signal and selects one or more of the plurality of P-type transistors in each circuit stage to delay a rising edge of the signal and one or more of the plurality of N-type transistors in each circuit stage to delay a falling edge of the signal, wherein the selector circuit receives as input the delay control signal that is based on a desired delay amount and a measure of instantaneous process, voltage and temperature conditions of an integrated circuit in which the plurality of transistors are implemented, the delay control signal comprising a delay select code comprising a plurality of bits and generates transistor select signals to activate one or more P-type transistors and N-type transistors in each circuit stage by decoding the delay control code to generate fine selection bits and coarse selection bits, and wherein selection of one or more N-type transistors and P-type transistors in each of the circuit stages is based on one or more of the fine selection bits and one or more of the coarse selection bits, wherein the selector circuit decodes a plurality of lower order bits of the delay select code according to a thermometer coding scheme to produce the fine selection bits and decodes a plurality of higher order bits of the delay select code according to a $2^n$ decoding scheme to produce the coarse selection bits.

25. A digitally programmable delay circuit comprising:

a. a plurality of circuit stages connected in series with each other, a first circuit stage being coupled to a line carrying a signal having edges to be delayed, each circuit stage comprising a plurality of transistors of a first type connected in parallel with each other, and a plurality of transistors of a second type connected in parallel with each other; and b. a synchronization circuit associated with one or more circuit stages, wherein each synchronization circuit receives a signal from an associated circuit stage to detect occurrence of an edge and supplies a synchronized control signal to the one or more associated circuit stages to ensure that transistor selection in the associated circuit stages occurs during a time interval between edges;

c. a selector circuit that is responsive to a delay control signal and selects one or more of the plurality of transistors of the first type in each circuit stage to delay a rising edge of the signal and one or more of the plurality of transistors of the second type in each circuit stage to delay a falling edge of the signal, and wherein the delay control signal is based on a desired delay amount and a measure of instantaneous process, voltage and temperature conditions of an integrated circuit in which the plurality of transistors are implemented.

26. A clock signal generation system comprising:

a. a plurality of circuit stages connected in series with each other, a first circuit stage being coupled to a line carrying a signal having edges to be delayed, each circuit stage comprising a plurality of transistors of a first type connected in parallel with each other, and a plurality of transistors of a second type connected in parallel with each other; and b. a selector circuit that is responsive to a delay control signal and selects one or more of the plurality of transistors of the first type in each circuit stage to delay a rising edge of the signal and one or more of the plurality of transistors of the second type in each circuit stage to delay a falling edge of the signal, and wherein the delay control signal is based on a desired delay amount and a measure of instantaneous process, voltage and temperature conditions of an integrated circuit in which the plurality of transistors are implemented;

c. a ring oscillator circuit implemented in the integrated circuit that generates a plurality of uniquely phased oscillator transition signals from which a clock signal is generated;

d. a comparator circuit implemented in the integrated circuit and coupled to the ring oscillator circuit that compares a speed of the ring oscillator circuit with a reference signal to generate a tracking value that represents said measure of the instantaneous process, voltage and temperature conditions of the integrated circuit; and e. a computation circuit implemented in the integrated circuit and coupled to the comparator circuit that generates the delay control signal based on the tracking value and the desired delay amount.

27. A clock signal generation system comprising:

a. a plurality of delay circuits, each delay circuit comprising:

i. a plurality of circuit stages connected in series with each other, a first circuit stage being coupled to a line carrying a signal having edges to be delayed, each circuit stage comprising a plurality of transistors of a first type connected in parallel with each other, and a plurality of transistors of a second type connected in parallel with each other; and ii. a selector circuit that is responsive to a delay control signal and selects one or more of the plurality of transistors of the first type in each circuit stage to delay a rising edge of the signal and one or more of the plurality of transistors of the second type in each circuit stage to delay a falling edge of the signal, and wherein the delay control signal is based on a desired delay amount and a measure of instantaneous process, voltage and temperature conditions of an integrated circuit in which the plurality of transistors are implemented;

b. a ring oscillator circuit that generates a plurality of uniquely phased oscillator transition signals from which at least one clock signal is generated;

c. waveform synthesizer logic circuitry coupled to the ring oscillator circuit that generates the at least one clock signal at a desired frequency to be supplied to a plurality of points on a circuit board;

d. a comparator circuit coupled to the ring oscillator circuit that compares a speed of the ring oscillator circuit with a reference signal to generate a tracking value that represents said measure of the instantaneous process, voltage and temperature conditions of the integrated circuit; and e. a plurality of computation circuits, each computation circuit coupled to the comparator circuit and receiving as input a corresponding desired delay value that synchronizes arrival of the clock signal at a corresponding one of the points on the circuit board with respect to each of the plurality of points on the circuit board, wherein each computation circuit generates a delay control signal for a corresponding one of the plurality of delay circuits based on the tracking value and the corresponding desired delay value;

f. wherein each of the plurality of delay circuits is coupled to receive the clock signal as the signal having the edges to be delayed, and each delay circuit produces an output clock signal having edges that are delayed with respect to edges of the clock signal in response to the delay control signal produced by an associated computation circuit.

28. A system on a circuit board comprising the clock signal generation system of claim 27, and further comprising a plurality of system components each positioned at a corresponding one of the plurality of points and electrically connected to receive the output clock signal produced by a corresponding one of the plurality of delay circuits.

* * * * *